US012771308B2

(12) United States Patent
Kim et al.

(10) Patent No.: US 12,771,308 B2
(45) Date of Patent: Oct. 20, 2026

(54) MILLIMETER-WAVE BAND LC FILTER

(71) Applicant: KOREA ELECTRONICS TECHNOLOGY INSTITUTE, Seongnam-si (KR)

(72) Inventors: Jun Chul Kim, Seongnam-si (KR); Dong Su Kim, Seongnam-si (KR); Je In Yu, Seoul (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 77 days.

(21) Appl. No.: 18/971,219

(22) Filed: Dec. 6, 2024

(65) Prior Publication Data

US 2025/0192745 A1 Jun. 12, 2025

(30) Foreign Application Priority Data

Dec. 6, 2023 (KR) ........................ 10-2023-0175981

(51) Int. Cl.
*H03H 7/01* (2006.01)
*H01F 27/28* (2006.01)
*H01G 4/30* (2006.01)

(52) U.S. Cl.
CPC ....... *H03H 7/0115* (2013.01); *H01F 27/2804* (2013.01); *H01G 4/30* (2013.01); *H03H 7/0123* (2013.01)

(58) Field of Classification Search
CPC ...... H03H 7/0123; H03H 7/0115; H03H 7/01; H03H 7/0107; H03H 7/0138; H03H 7/0153

(Continued)

(56) References Cited

U.S. PATENT DOCUMENTS

2023/0187799 A1* 6/2023 Niu ........................ H01P 1/2053 333/208
2024/0136995 A1* 4/2024 Kikuda .................... H03H 7/09
2025/0183867 A1* 6/2025 Yu ........................ H03H 7/0115

FOREIGN PATENT DOCUMENTS

KR 10-1555943 B1 9/2015
KR 10-2022-0161554 A 12/2022

(Continued)

OTHER PUBLICATIONS

Korean Office Action issued on Dec. 11, 2024, in connection with the corresponding Korean Patent Application No. 10-2023-0175981, along with an English machine translation. (13 pages).

*Primary Examiner* — Stephen E. Jones
(74) *Attorney, Agent, or Firm* — Hauptman Ham, LLP

(57) ABSTRACT

Disclosed is a millimeter-wave (mmWave) band LC filter that is applied to a high-frequency signal in a mmWave band. The mmWave band LC filter includes a first ground layer providing an electrical ground, a second ground layer, a via wall having an end connected to the first ground layer and another end connected to the second ground layer, a blocking wall dividing a resonance space into sub-spaces, holes formed in the second ground layer to open the sub-spaces, pins connected to the first ground layer while passing through the holes, pin electrodes connected to the pins and spaced apart from the second ground layer while facing a portion of the second ground layer, a floating electrode spaced apart from the pin electrodes while facing portions of two of the pin electrodes, and input/output terminals connected to the pin electrodes or the floating electrode and configured to receive and output signals.

12 Claims, 16 Drawing Sheets

(58) Field of Classification Search
USPC .................................................. 333/175, 185
See application file for complete search history.

(56) References Cited

FOREIGN PATENT DOCUMENTS

| | | | |
|---|---|---|---|
| KR | 10-2023-0158420 | A | 11/2023 |
| WO | 2021/208761 | A1 | 10/2021 |

* cited by examiner

MILLIMETER-WAVE BAND LC FILTER

CROSS REFERENCE TO RELATED APPLICATION

This patent document claims the priority and benefits of Korean Patent Application No. 10-2023-0175981, filed Dec. 6, 2023, the entire contents of which are incorporated herein by reference for all purposes.

TECHNICAL FIELD

The present disclosure relates to a millimeter-wave (mm-Wave) band LC filter.

BACKGROUND

Filters are used to pass necessary frequencies or block unnecessary frequencies. Such a filter may include a capacitor and an inductor. Various types of filters, such as a coupled microstrip line filter, a multilayer ceramic filter, a surface acoustic wave (SAW) filter, a bulk acoustic wave (BAW) filter, and a substrate integrated waveguide (SIW) filter, are used. In order to be used in a high-frequency band such as a mmWave band, filters are required to have high performance and a compact size.

SUMMARY

The present disclosure provides a coaxial resonator-type millimeter-wave (mmWave) band LC filter in which a pin is disposed at the center of a space surrounded by a via wall.

The present disclosure provides a mmWave band LC filter including a bridge interconnecting pins of two coaxial resonators.

In accordance with an aspect of the present disclosure, a mmWave band LC filter includes a first ground layer configured to provide an electrical ground, a second ground layer spaced apart from the first ground layer, a via wall having one end connected to the first ground layer and an other end connected to the second ground layer, the via wall including a plurality of vias spaced apart from each other, a blocking wall formed as a part of the via wall so as to protrude toward the interior of a resonance space defined by the first ground layer, the via wall, and the second ground layer, thereby dividing the resonance space into a plurality of sub-spaces, a plurality of holes, each being formed in the second ground layer to open one side of a respective one of the plurality of sub-spaces divided by the blocking wall, a plurality of pins, each having one end connected to the first ground layer and an other end passing through a respective one of the plurality of holes, a plurality of pin electrodes, each being connected to the other end of a respective one of the plurality of pins, spaced apart from the second ground layer, and formed to face a portion of the second ground layer, a floating electrode spaced apart from the plurality of pin electrodes and formed to face portions of two pin electrodes among the plurality of pin electrodes, and a plurality of input/output terminals directly connected to or spaced apart from the plurality of pin electrodes and configured to receive and output signals.

According to an embodiment, the mmWave band LC filter may further include one or more bridges interconnecting two pins among the plurality of pins.

According to an embodiment, the distance between the bridge and the first ground layer may be determined in accordance with required increase in the amount of inductive coupling between the two pins. As the distance between the bridge and the first ground layer increases, the amount of inductive coupling may increase more greatly.

According to an embodiment, the cross-sectional area of the bridge may be determined in accordance with required increase in the amount of inductive coupling between the two pins. As the cross-sectional area of the bridge increases, the amount of inductive coupling may increase more greatly.

According to an embodiment, the blocking wall may divide the resonance space into a first sub-space and a second sub-space, and the first sub-space and the second sub-space may be connected to each other through a space defined in the blocking wall.

According to an embodiment, the plurality of holes may include a first hole formed in a portion of the second ground layer corresponding to the first sub-space and a second hole formed in a portion of the second ground layer corresponding to the second sub-space.

According to an embodiment, the plurality of pins may include a first pin disposed at the center of the first sub-space while passing through the first hole and a second pin disposed at the center of the second sub-space while passing through the second hole.

According to an embodiment, the plurality of pin electrodes may include a first pin electrode connected to the other end of the first pin and a second pin electrode connected to the other end of the second pin.

According to an embodiment, the floating electrode may be formed to face a portion of the first pin electrode and a portion of the second pin electrode.

According to an embodiment, the plurality of input/output terminals may include a first input/output terminal spaced apart from the first pin electrode while partially facing the first pin electrode and a second input/output terminal spaced apart from the second pin electrode while partially facing the second pin electrode.

According to an embodiment, the mmWave band LC filter may further include a bridge interconnecting the first pin and the second pin.

According to an embodiment, the blocking wall may divide the resonance space into a first sub-space, a second sub-space, a third sub-space, and a fourth sub-space.

According to an embodiment, the first sub-space and the second sub-space may be connected to each other through a space defined in the blocking wall, the second sub-space and the third sub-space may be connected to each other through a space defined in the blocking wall, the third sub-space and the fourth sub-space may be connected to each other through a space defined in the blocking wall, and the first sub-space and the fourth sub-space may be completely separated from each other by the blocking wall.

According to an embodiment, the plurality of holes may include a first hole formed in a portion of the second ground layer corresponding to the first sub-space, a second hole formed in a portion of the second ground layer corresponding to the second sub-space, a third hole formed in a portion of the second ground layer corresponding to the third sub-space, and a fourth hole formed in a portion of the second ground layer corresponding to the fourth sub-space.

According to an embodiment, the plurality of pins may include a first pin disposed at the center of the first sub-space while passing through the first hole, a second pin disposed at the center of the second sub-space while passing through the second hole, a third pin disposed at the center of the third sub-space while passing through the third hole, and a fourth pin disposed at the center of the fourth sub-space while passing through the fourth hole.

According to an embodiment, the plurality of pin electrodes may include a first pin electrode connected to the other end of the first pin, a second pin electrode connected to the other end of the second pin, a third pin electrode connected to the other end of the third pin, and a fourth pin electrode connected to the other end of the fourth pin.

According to an embodiment, the floating electrode may include a first floating electrode formed to face a portion of the first pin electrode and a portion of the second pin electrode, a second floating electrode formed to face a portion of the second pin electrode and a portion of the third pin electrode, a third floating electrode formed to face a portion of the third pin electrode and a portion of the fourth pin electrode, and a fourth floating electrode formed to face a portion of the fourth pin electrode and a portion of the first pin electrode.

According to an embodiment, the plurality of input/output terminals may include a first input/output terminal connected to the first pin electrode and a second input/output terminal connected to the fourth pin electrode.

According to an embodiment, the plurality of input/output terminals may include a first input/output terminal spaced apart from the first pin electrode while partially facing the first pin electrode and a second input/output terminal spaced apart from the fourth pin electrode while partially facing the fourth pin electrode.

According to an embodiment, the mmWave band LC filter may further include one or more bridges interconnecting two pins among the first pin, the second pin, the third pin, and the fourth pin.

According to an embodiment, the one or more bridges may include a first bridge interconnecting the first pin and the second pin, a second bridge interconnecting the second pin and the third pin, and a third bridge interconnecting the third pin and the fourth pin.

According to an embodiment, the mmWave band LC filter may be formed inside a multilayer substrate formed by stacking a plurality of sub-substrates.

The features and advantages of the present disclosure will become more obvious from the following detailed description provided with reference to the accompanying drawings.

Before explaining embodiments of the present disclosure, it is to be understood that the phraseology and terminology used in the following specification and appended claims should not be construed as limited to general and dictionary meanings but be construed as having meanings and concepts according to the spirit of the present disclosure on the basis of the principle that the inventor is permitted to define appropriate terms for the best explanation.

BRIEF DESCRIPTION OF THE DRAWINGS

The above and other objects, features, and other advantages of the present disclosure will be more clearly understood from the following detailed description taken in conjunction with the accompanying drawings, in which.

DETAILED DESCRIPTION OF THE INVENTION

Figure 1:
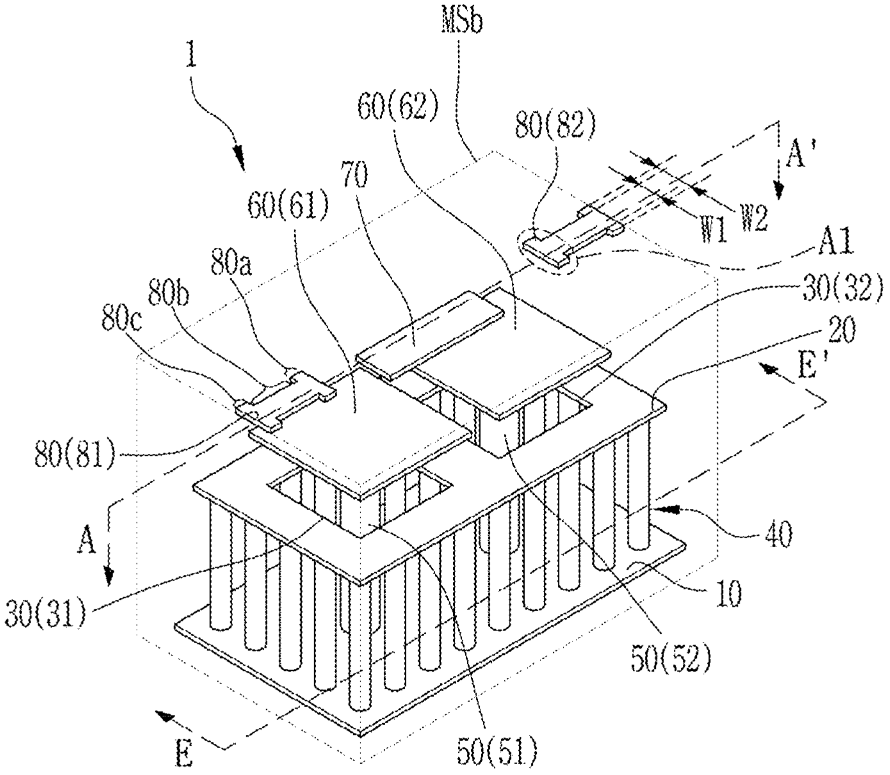
FIG. 1 is a perspective view showing a millimeter-wave (mmWave) band LC filter according to an embodiment.

Hereinafter, exemplary embodiments of the present disclosure will be described in detail with reference to the accompanying drawings. However, the exemplary embodiments of the present disclosure to be described below are provided by way of example, and the present disclosure is not limited to the exemplary embodiments set forth herein.

In assigning reference numerals to components in the drawings, it should be noted that identical components are assigned the same reference numerals wherever possible even though they are depicted in different drawings, and similar components are assigned similar reference numerals.

Terms used to describe an embodiment of the present disclosure are not intended to limit the disclosure. It should be noted that singular forms include plural forms as well unless the context clearly indicates otherwise.

In the drawings, components may be exaggerated in size, omitted, or schematically illustrated for convenience in description and clarity. It will be further understood that the terms "have," "may have," "include," and/or "may include," when used herein, specify the presence of the stated feature (e.g., a numerical value, function, operation, or component such as a part), but do not preclude the presence or addition of one or more other features.

Terms such as "one", "other", "another", "first", "second", etc. are used herein to distinguish one component from another component, and the components are not limited by these terms.

Terms indicating directions, such as up, down, left, right, X-axis, Y-axis, Z-axis, etc. are only for convenience of explanation, and it should be understood that these terms may be expressed differently depending on the location of the observer or the location of the object.

The embodiments described herein and the accompanying drawings are not intended to limit the disclosure to specific embodiments. The present disclosure should be understood to include various modifications, equivalents, and/or alternatives to the embodiments.

Hereinafter, embodiments of the present disclosure will be described in detail with reference to the accompanying drawings.

Figure 2:
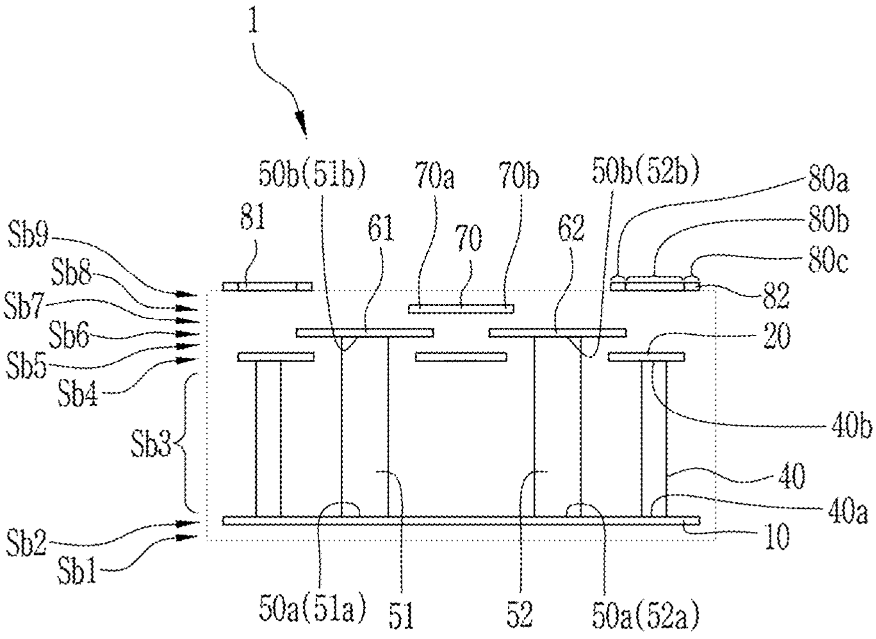
FIG. 2 is a cross-sectional view taken along line A-A' in FIG. 1.
Figure 3:
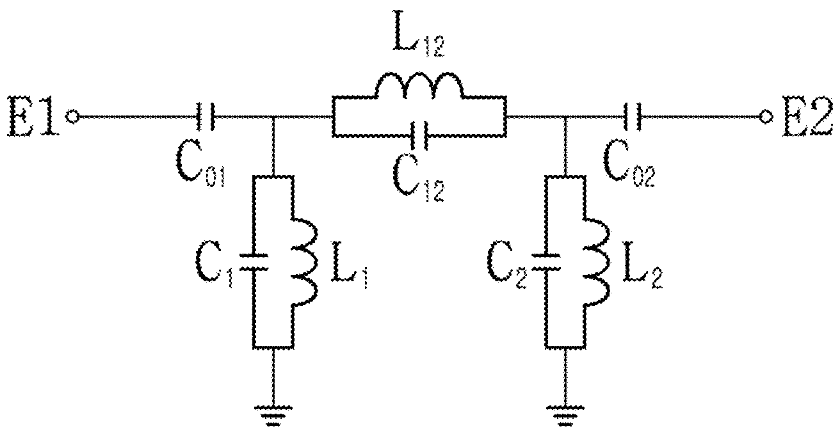
FIG. 3 is a circuit diagram of the mmWave band LC filter shown in FIG. 1.
Figure 4:
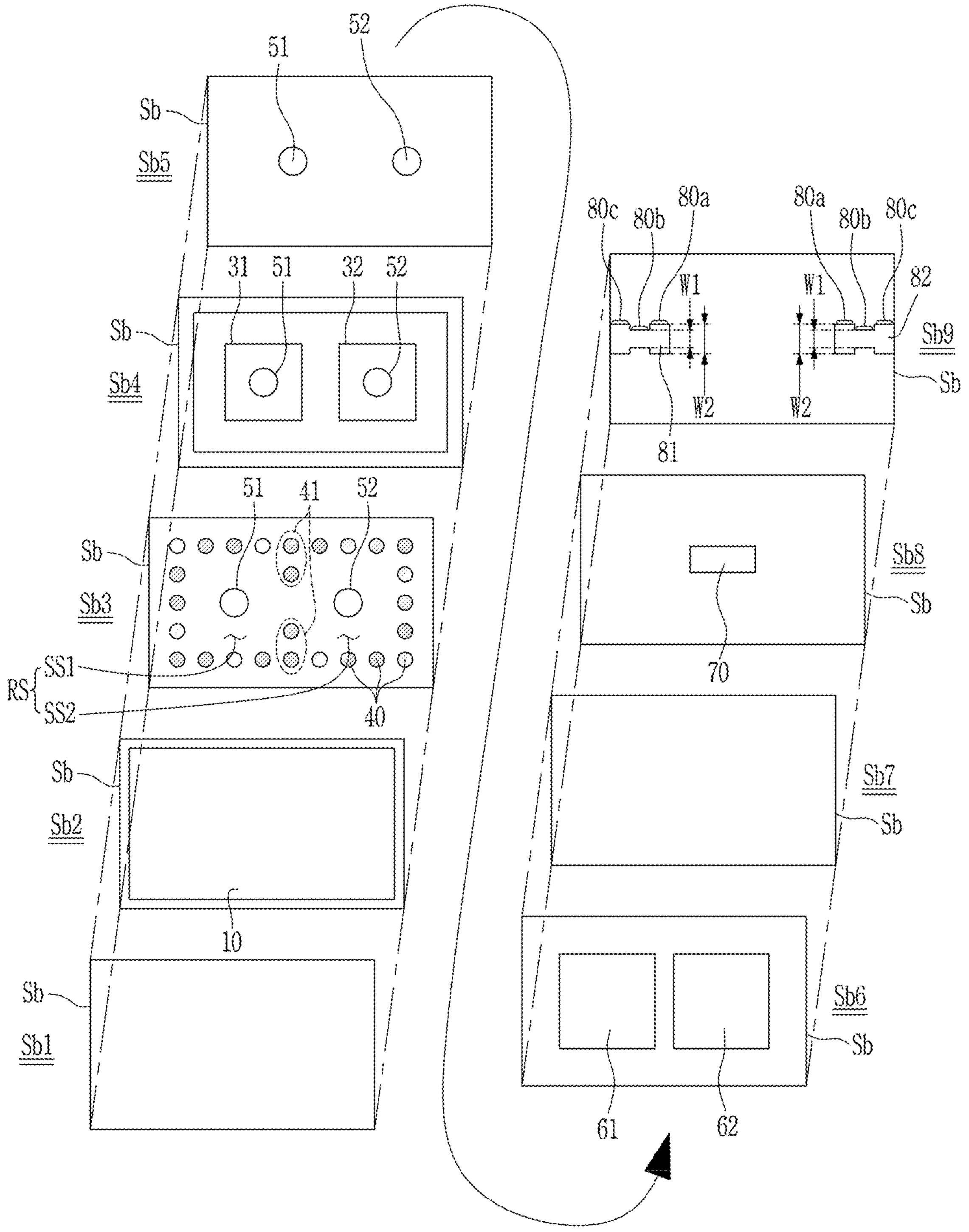
FIG. 4 is an exploded view of the mmWave band LC filter shown in FIG. 1.

FIG. 1 is a perspective view showing a millimeter-wave (mmWave) band LC filter 1 according to an embodiment. FIG. 2 is a cross-sectional view taken along line A-A' in FIG. 1. FIG. 3 is a circuit diagram of the mmWave band LC filter 1 shown in FIG. 1. FIG. 4 is an exploded view of the mmWave band LC filter 1 shown in FIG. 1. FIG. 1, FIG. 2, FIG. 3, and FIG. 4 will be referred to together.

The mmWave band LC filter 1 according to an embodiment may be formed inside a multilayer substrate MSb formed by stacking a plurality of sub-substrates Sb. The mmWave band LC filter 1 may be used in a mmWave band, and may have the overall structure of a resonant filter. A via wall 40 may be applied to the outer periphery of the resonant filter structure.

The mmWave band LC filter 1 according to the embodiment may include a first ground layer 10 configured to provide an electrical ground, a second ground layer 20 spaced apart from the first ground layer 10, a via wall 40 having an end 40*a* connected to the first ground layer 10 and another end 40*b* connected to the second ground layer 20 and including a plurality of vias spaced apart from each other, a blocking wall 41 formed as a part of the via wall 40 so as to protrude toward the interior of a resonance space RS defined by the first ground layer 10, the via wall 40, and the second ground layer 20, thereby dividing the resonance space RS into a plurality of sub-spaces SS, a plurality of holes 30, each of which is formed in the second ground layer 20 to open one side of a respective one of the plurality of sub-spaces SS divided by the blocking wall 41, a plurality of pins 50, each of which has an end 50*a* connected to the first ground layer 10 and another end 50*b* passing through a respective one of the plurality of holes 30, a plurality of pin electrodes 60, each of which is connected to the other end 50*b* of a respective one of the plurality of pins 50, is spaced apart from the second ground layer 20, and is formed to face a portion of the second ground layer 20, a floating electrode 70 spaced apart from the plurality of pin electrodes 60 and formed to face portions of two pin electrodes 60 among the plurality of pin electrodes 60, and a plurality of input/output terminals 80 connected to the pin electrodes 60 or the floating electrode 70 and configured to receive and output signals.

The multilayer substrate MSb may be formed by stacking a plurality of sub-substrates Sb.

The first ground layer 10 may be formed inside the multilayer substrate MSb. The first ground layer 10 may be formed on one surface of a sub-substrate Sb. The first ground layer 10 may be used as an electrical ground in the mmWave band LC filter 1.

The second ground layer 20 may be formed inside the multilayer substrate MSb. The second ground layer 20 may be formed at a position spaced apart from the first ground layer 10. The second ground layer 20 may be formed on one surface of a sub-substrate Sb spaced a predetermined distance from the sub-substrate Sb on which the first ground layer 10 is formed.

The first ground layer 10 and the second ground layer 20 may be formed of an electrically conductive material. For example, the first ground layer 10 and the second ground layer 20 may be formed of copper (Cu), aluminum (Al), silver (Ag), any of other electrically conductive metals, an alloy containing metals, an electrically conductive compound, an electrically conductive mixture, or the like.

The via wall 40 may be formed to connect the first ground layer 10 and the second ground layer 20 to each other. The via wall 40 may include a plurality of conductive vias. The plurality of conductive vias may be formed to penetrate the plurality of sub-substrates Sb disposed between the first ground layer 10 and the second ground layer 20. The plurality of conductive vias may be formed in such a manner that through-holes formed through the sub-substrates Sb are filled or coated with an electrically conductive material. One end 40*a* of each of the plurality of conductive vias may be connected to the first ground layer 10, and the other end 40*b* of each of the plurality of conductive vias may be connected to the second ground layer 20. The plurality of conductive vias may be spaced a predetermined interval from each other. The interval between the plurality of conductive vias may be set to be less than half (λ/2) the wavelength of the signal band in which the mmWave band LC filter 1 is used. The via wall 40 may be formed to surround a predetermined area.

The space surrounded by the first ground layer 10, the via wall 40, and the second ground layer 20 may function as a resonance space RS in which a signal may resonate. Because the interval between the plurality of conductive vias of the via wall 40 is less than half (λ/2) the wavelength of the signal band in which the mmWave band LC filter 1 is used, a signal may not be emitted to the outside. The resonance space RS may have a substantially hexahedral shape defined by the first ground layer 10 as a bottom surface, the second ground layer 20 as a top surface, and the via wall 40 as side surfaces.

The resonance space RS may be divided into a plurality of sub-spaces SS by the blocking wall 41. Among the plurality of sub-spaces SS, adjacent sub-spaces SS may be connected to each other through an area in which the blocking wall 41 is not formed. The blocking wall 41 may be a part of the via wall 40. The blocking wall 41 may include one or more conductive vias. The blocking wall 41 may be formed to protrude toward the interior of the space surrounded by the via wall 40 (i.e., the resonance space RS). The blocking wall 41 may be provided in plural. Two blocking walls 41, which are disposed so as to face each other and spaced apart from each other, may divide the resonance space RS into the sub-spaces SS. The sub-spaces SS, into which the hexahedral resonance space RS is divided, may have a substantially hexahedral shape.

A plurality of holes 30 may be formed in the second ground layer 20. The holes 30 may be formed by removing portions of the second ground layer 20. Because the holes 30 are portions cut out of the second ground layer 20, portions of the resonance space RS may be open through the holes 30. The holes 30 may be formed in a circular or rectangular shape.

The plurality of pins 50 may be formed to penetrate the plurality of sub-substrates Sb. The pins 50 may be formed in such a manner that through-holes formed through the plurality of sub-substrates Sb are filled or coated with an electrically conductive material. One end 50*a* of each of the plurality of pins 50 may be connected to the first ground layer 10, and the other end 50*b* of each of the plurality of pins 50 may pass through a respective one of the holes 30 and may extend outward beyond the second ground layer 20. The plurality of pins 50 may be formed inside the multilayer substrate Msb. Each of the pins 50 may be located in a respective one of the holes 30 corresponding to the sub-spaces SS. Each of the pins 50 may be located at the center of a respective one of the holes 30. Each of the pins 50 may be located at the center of a respective one of the sub-spaces SS surrounded by the via wall 40 and the blocking wall 41.

The pins 50 may function as an inductor when transmitting a high-frequency signal. Two adjacent pins 50 may form inductive coupling. Each of the pins 50 may be modeled as an inductor on a circuit, one end of which is connected to the ground and the other end of which is connected to another inductor or a capacitor. Inductive coupling between two adjacent pins 50 may be modeled as an inductor interconnecting two adjacent inductors on a circuit.

The plurality of pin electrodes 60 may be formed on the sub-substrate Sb. Each of the pin electrodes 60 may be connected to the other end of a respective one of the pins 50. The other end of the pin 50 may be connected to the center of the pin electrode 60. The pin electrode 60 may be formed in a circular or rectangular shape. The pin electrode 60 may be formed in the same shape as the hole 30. For example, both the pin electrode 60 and the hole 30 may be formed in a rectangular shape. The area of the pin electrode 60 may be formed to be larger than the area of the hole 30. The pin electrode 60 and the hole 30 may be formed in different shapes so that there is an area in which a portion of the pin electrode 60 and a portion of the hole 30 face each other. Alternatively, if the pin electrode 60 and the hole 30 are formed in the same shape, if the centers of the pin electrode 60, the hole 30, and the pin 50 are located on the same line, and if the area of the pin electrode 60 is larger than the area of the hole 30, there may be an area in which a portion of the pin electrode 60 and a portion of the second ground layer 20 face each other. Alternatively, the pin electrode 60 may be formed in a rectangular shape, and the hole 30 may be formed in a square shape. Alternatively, the pin electrode 60 may be formed in a polygonal shape so that a portion thereof extends beyond the edge of the hole 30 and faces a portion of the second ground layer 20. Regardless of the shapes of the pin electrode 60 and the hole 30, portions of the pin electrode 60 and the second ground layer 20 that face each other and the sub-substrate Sb located therebetween may be modeled as a capacitor on a circuit.

In this specification, the expression "there are portions facing each other" or "there is an area in which a portion of one component faces another component" means a structure in which, for example, a first electrode and a second electrode of a general capacitor face each other with a dielectric layer interposed therebetween. That is, it can also be expressed as a structure in which two electrodes overlap each other with a sub-substrate Sb interposed therebetween.

The floating electrode 70 may be provided singularly or in plural. The floating electrode 70 may be expressed as "floating" because the same is spaced apart from the pin electrodes 60. The floating electrode 70 may be formed over the two pin electrodes 60 while being spaced apart therefrom. The floating electrode 70 may be formed in a square shape, a rectangular shape, or any of other polygonal shapes. The floating electrode 70 may be disposed so as to face portions of the two pin electrodes 60. One end **70*a* of the floating electrode 70 may face a portion of one of the two pin electrodes 60, and the other end 70*b* of the floating electrode 70 may face a portion of the other of the two pin electrodes 60. The end 70*a* of the floating electrode 70, the portion of one pin electrode 60 facing the end 70*a* of the floating electrode 70, the other end 70*b* of the floating electrode 70, the portion of the other pin electrode 60 facing the other end 70*b* of the floating electrode 70**, and the sub-substrate Sb therebetween may be modeled as a capacitor interconnecting two adjacent capacitors on a circuit.

The input/output terminals 80 may be disposed so as to be connected to the pin electrodes 60 or may be disposed so as to be spaced apart from the pin electrodes 60. When the input/output terminals 80 are connected to the pin electrodes 60, the configuration may be modeled as a configuration in which signals are input and output through an inductor. Alternatively, when the input/output terminals 80 are disposed so as to partially face the pin electrodes 60 while being spaced apart therefrom, the configuration may be modeled as a configuration in which signals are input and output through a capacitor. In the case in which the mmWave band LC filter 1 is implemented as an independent device, the input/output terminals 80 may be formed such that one end of each of the input/output terminals 80 is exposed to the outside of the multilayer substrate MSb so as to be connected to an external circuit. Alternatively, the mmWave band LC filter 1 may be formed on a part of an interposer substrate or may be formed as a part of a semiconductor package. In this case, the input/output terminals 80 may be connected to another circuit formed on the multilayer substrate MSb or to another semiconductor chip connected to the multilayer substrate MSb. Here, the multilayer substrate MSb may be an interposer substrate on which a semiconductor chip is mounted or may be a part of a semiconductor package. The input/output terminals 80 may transmit and receive electric signals in a mmWave band to and from an external circuit.

Each of the input/output terminals 80 may be formed such that a portion **80*a* thereof facing the pin electrode 60, a portion 80*b* thereof facing the second ground layer 20, and a portion 80*c* thereof facing the first ground layer 10 have different areas or widths. The area A1 of the portion 80*a* of the input/output terminal 80 facing the pin electrode 60 may be determined in accordance with the capacity of a capacitor used for input/output of an electric signal. The portion 80*b* of the input/output terminal 80 facing the second ground layer 20 may function as a strip line, and thus the width W1 thereof may be determined in accordance with the distance from the second ground layer 20. The portion 80*c* of the input/output terminal 80 facing the first ground layer 10 may function as a strip line, and thus the width W2 thereof may be determined in accordance with the distance from the first ground layer 10**.

The first ground layer 10, the second ground layer 20, the pin electrodes 60, and the floating electrode 70 described above may be conductive metal electrodes formed on the sub-substrate Sb through electroplating, deposition, or the like. The via wall 40, the blocking wall 41, and the pin 50 described above may be conductive vias formed to penetrate the plurality of sub-substrates Sb. The multilayer substrate MSb may be formed by stacking the plurality of sub-substrates Sb, and the circuit of the mmWave band LC filter 1 may be formed thereinside.

A mmWave band LC filter 1 in which two pins 50 are formed will be described with reference to FIGS. 1, 2, 3, and 4.

The mmWave band LC filter 1 may include a first ground layer 10, a second ground layer 20 spaced apart from the first ground layer 10, and a via wall 40 having a plurality of conductive vias interconnecting the first ground layer 10 and the second ground layer 20.

A blocking wall 41, which is a part of the via wall 40, may divide a resonance space RS surrounded by the first ground layer 10, the via wall 40, and the second ground layer 20 into two sub-spaces SS. The blocking wall 41 may divide the resonance space RS into a first sub-space SS1 and a second sub-space SS2, and the first sub-space SS1 and the second sub-space SS2 may be connected to each other through a space defined in the blocking wall 41.

The holes 30 may include a first hole 31 formed in a portion of the second ground layer 20 corresponding to the first sub-space SS1 and a second hole 32 formed in a portion of the second ground layer 20 corresponding to the second sub-space SS2. The first hole 31 and the second hole 32 may be spaced apart from each other.

The plurality of pins 50 may include a first pin 51 disposed at the center of the first sub-space SS1 while passing through the first hole 31 and a second pin 52 disposed at the center of the second sub-space SS2 while passing through the second hole 32. The first pin 51 may be modeled as $L_1$ in FIG. 3, and the second pin 52 may be modeled as $L_2$ in FIG. 3. Inductive coupling formed between the first pin 51 and the second pin 52 through a connection portion between the first sub-space SS1 and the second sub-space SS2 may be modeled as $L_{12}$ in FIG. 3.

The plurality of pin electrodes 60 may include a first pin electrode 61 connected to the other end of the first pin 51 and a second pin electrode 62 connected to the other end of the second pin 52. A capacitor formed by a portion of the first pin electrode 61, a portion of the second ground layer 20, and the sub-substrate Sb therebetween may be modeled as $C_1$ in FIG. 3, and a capacitor formed by a portion of the second pin electrode 62, a portion of the second ground layer 20, and the sub-substrate Sb therebetween may be modeled as $C_2$ in FIG. 3.

The floating electrode 70 may be formed to face a portion of the first pin electrode 61 and a portion of the second pin electrode 62. One end 70*a* of the floating electrode 70, a portion of the first pin electrode 61, the other end 70*b* of the floating electrode 70, a portion of the second pin electrode 62, and the sub-substrate Sb therebetween may be modeled as $C_{12}$ in FIG. 3.

The input/output terminals 80 may include a first input/output terminal 81 spaced apart from the first pin electrode 61 while partially facing the first pin electrode 61 and a second input/output terminal 82 spaced apart from the second pin electrode 62 while partially facing the second pin electrode 62. The input/output terminals 80 may be represented by E1 and E2 in FIG. 3. A portion of the first input/output terminal 81 and a portion of the first pin electrode 61 that face each other may function as a capacitor and may be modeled as $C_{01}$ in FIG. 3. A portion of the second input/output terminal 82 and a portion of the second pin electrode 62 that face each other may function as a capacitor and may be modeled as $C_{02}$ in FIG. 3.

The two-pin-type mmWave band LC filter 1 having the structure shown in FIGS. 1 and 2 may be modeled as the circuit shown in FIG. 3. As shown in FIG. 3, the mmWave band LC filter 1 may implement a parallel resonance circuit.

FIGS. 2 and 4 will be referred to together. The multilayer structure of the mmWave band LC filter 1, which is formed in a structure of the multilayer substrate MSb formed by stacking the plurality of sub-substrates Sb, will be described with reference to the exploded view illustrated in FIG. 4. Each of the layers shown in FIGS. 2 and 4 may be constituted by one or more sub-substrates Sb.

The first layer Sb1 may include one or more sub-substrates Sb.

The second layer Sb2 may include one or more sub-substrates Sb. The second layer Sb2 is a layer that is stacked on the first layer Sb1 and includes the first ground layer 10.

The third layer Sb3 may be stacked on the second layer Sb2 and may include the via wall 40, the blocking wall 41, and the pins 50, which penetrate the plurality of sub-substrates Sb. The via wall 40, the blocking wall 41, and the pins 50 may be constituted by conductive vias penetrating the plurality of sub-substrates Sb. The first pin 51 and the second pin 52 may be formed at the centers of the first sub-space SS1 and the second sub-space SS2 surrounded by the via wall 40 and the blocking wall 41. The third layer Sb3 may include one or more or a plurality of sub-substrates Sb spanning the distance between the first ground layer 10 and the second ground layer 20. Because the third layer Sb3 is stacked on the second layer Sb2, the via wall 40, the blocking wall 41, and the pins 50 may be connected to the first ground layer 10.

The fourth layer Sb4 is a layer that is stacked on the third layer Sb3 and includes the second ground layer 20. The fourth layer Sb4 may include one or more sub-substrates Sb. The fourth layer Sb4 may include the second ground layer 20 connected to the other ends of the conductive vias. The second ground layer 20 may have a first hole 31 and a second hole 32 formed therein. The fourth layer Sb4 may include portions of the pins 50 penetrating the sub-substrates Sb.

The fifth layer Sb5 may be stacked on the fourth layer Sb4 and may include portions of the pins 50 penetrating the sub-substrates Sb. The fifth layer Sb5 may include one or more sub-substrates Sb. The length of the pins 50 may correspond to the thicknesses of the third layer Sb3, the fourth layer Sb4, and the fifth layer Sb5. The fifth layer Sb5 may correspond to the sub-substrate Sb disposed between the second ground layer 20 and the pin electrodes 60. If the pin electrodes 60 and the second ground layer 20 are electrodes of a capacitor, the sub-substrate Sb of the fifth layer Sb5 may correspond to a dielectric layer of the capacitor.

The sixth layer Sb6 may be stacked on the fifth layer Sb5 and may include the pin electrodes 60. The sixth layer Sb6 may include one or more sub-substrates Sb. The pin electrodes 60 may be formed to be connected to the other ends of the pins 50. The sixth layer Sb6 may include a first pin electrode 61 connected to the first pin 51 and a second pin electrode 62 connected to the second pin 52. The first pin electrode 61 and the second pin electrode 62 are spaced apart from each other.

The seventh layer Sb7 may be stacked on the sixth layer Sb6 and may include one or more sub-substrates Sb. The seventh layer Sb7 may correspond to the sub-substrate Sb disposed between the pin electrodes 60 and the floating electrode 70. If the pin electrodes 60 and the floating electrode 70 are electrodes of a capacitor, the sub-substrate Sb of the seventh layer Sb7 may correspond to a dielectric layer of the capacitor.

The eighth layer Sb8 may be stacked on the seventh layer Sb7 and may include the floating electrode 70. The eighth layer Sb8 may include one or more sub-substrates Sb. The floating electrode 70 may be disposed such that one end 70*a* thereof faces the first pin electrode 61 and the other end 70*b* thereof faces the second pin electrode 62.

The ninth layer Sb9 may be stacked on the eighth layer Sb8 and may include one or more sub-substrates Sb. The ninth layer Sb9 may include a first input/output terminal 81 and a second input/output terminal 82. The input/output terminals 81 and 82 spaced apart from the pin electrodes 61 and 62 may be disposed in the seventh layer Sb7. The input/output terminals (refer to 81 and 82 in FIG. 14) connected to the pin electrodes 61 and 62 may be formed in the sixth layer Sb6.

If a band-pass filter is implemented in a conventional strip line-based distributed element structure, the wavelength is very short in the mmWave band, and thus a λ/2 resonator is used. Therefore, the size of the filter is relatively large in the 30 GHz to 40 GHz band.

Meanwhile, in order to facilitate design of a band-pass filter, it is preferable to use an LC-type design method. The LC-type design method enables implementation of an attenuation pole at a desired position and implementation of a desired band-pass skirt characteristic with a relatively small number of resonators. Accordingly, it is possible to implement a small low-loss band-pass filter.

The dielectric constant of a ceramic material that is usable for a mmWave band multilayer ceramic filter is about 5 to 6 C/Vm. In this case, the wavelength of a signal in the 30 GHz band may be 4 to 4.5 mm, and the ¼ wavelength (λ/4) may be 1 to 1.125 mm. Considering that a general filter component has a size of 1.6 mm×0.8 mm or more, the size of an LC circuit pattern therein may be formed to be similar to the ¼ wavelength (λ/4) of the signal. In this case, a phase difference occurs in the capacitor pattern, and resultant generation of current may generate undesired inductance. Because this phenomenon also occurs similarly in the inductor pattern, it is difficult to implement the filter.

In contrast, the mmWave band LC filter 1 according to the embodiment may implement a band-pass characteristic in the 30 GHz to 40 GHz band. The mmWave band LC filter 1 described with reference to FIGS. 1, 2, 3, and 4 may transmit a high-frequency signal in a transverse electromagnetic (TEM) mode in the thickness direction of the multilayer substrate MSb. The mmWave band LC filter 1 according to the embodiment has a structure in which an LC pattern is formed on a plane perpendicular to the direction in which a signal is transmitted in the TEM mode. A plurality of conductive vias is formed in the thickness direction of the multilayer substrate MSb. Among the plurality of conductive vias, the pin 50 corresponds to a central conductive via, and the other conductive vias are arranged about the pin 50 in a coaxial structure. Accordingly, a high-frequency signal may be transmitted in the thickness direction of the multilayer substrate MSb in the TEM mode. When the high-frequency signal is transmitted in the thickness direction of the multilayer substrate MSb in the TEM mode, the phase of the high-frequency signal is constant in the plane direction of the multilayer substrate MSb. Accordingly, it is possible to easily design the LC pattern without phase change. In addition, since the LC-type band-pass filter structure is implemented, the band-pass characteristic may be easily designed.

Figure 5:
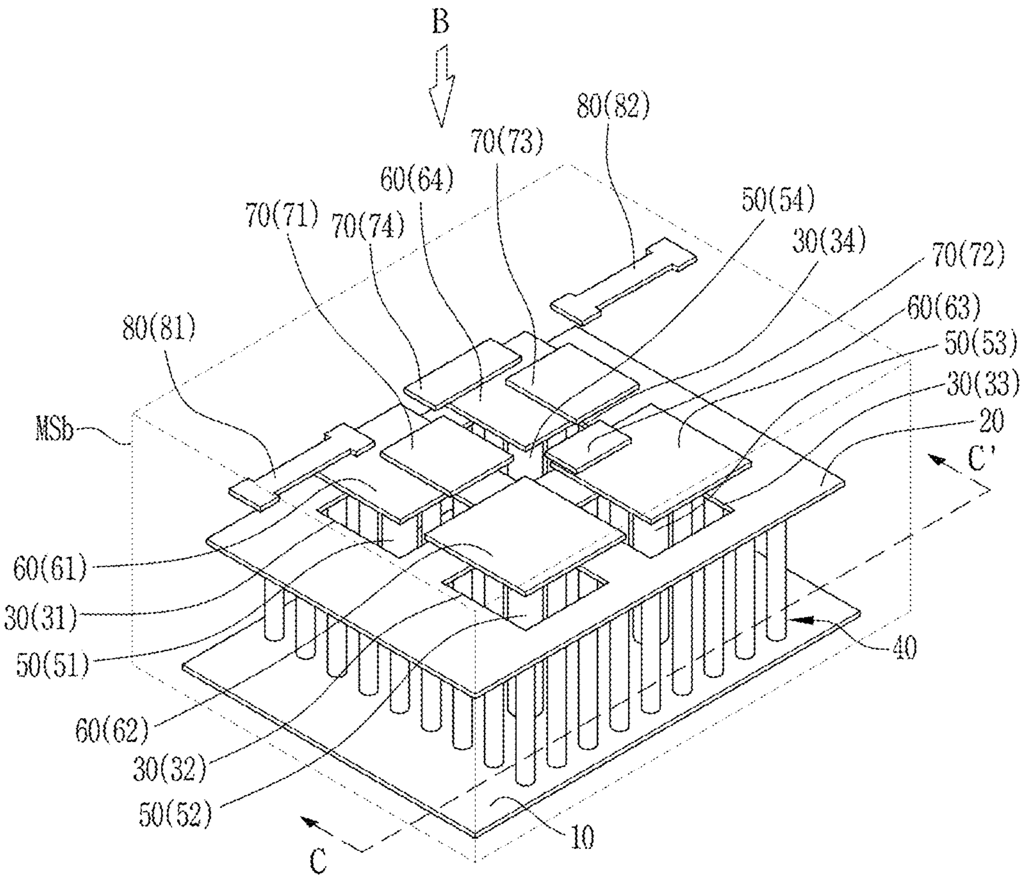
FIG. 5 is a perspective view showing a mmWave band LC filter according to another embodiment.
Figure 6:
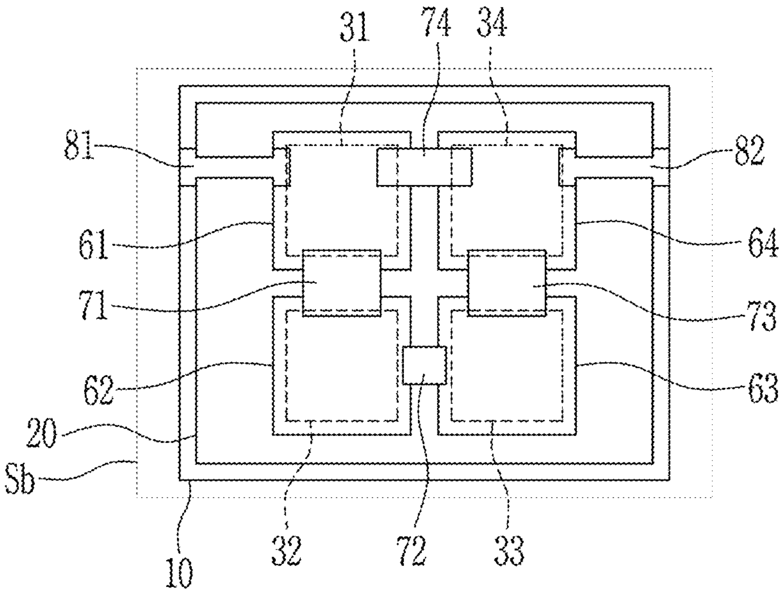
FIG. 6 is a plan view of the mmWave band LC filter when viewed in the direction of arrow B in FIG. 5.
Figure 7:
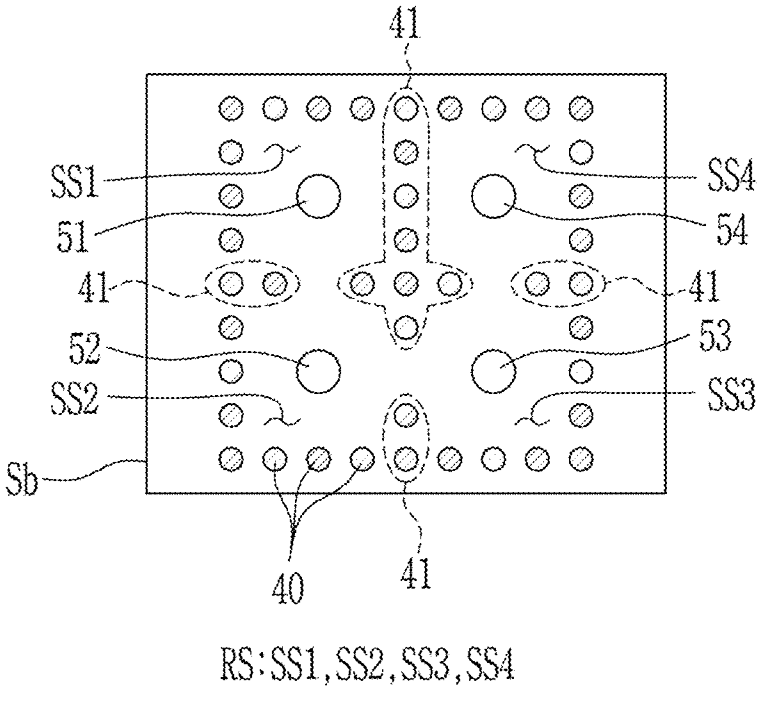
FIG. 7 is a cross-sectional view taken along line C-C' in FIG. 5.
Figure 8:
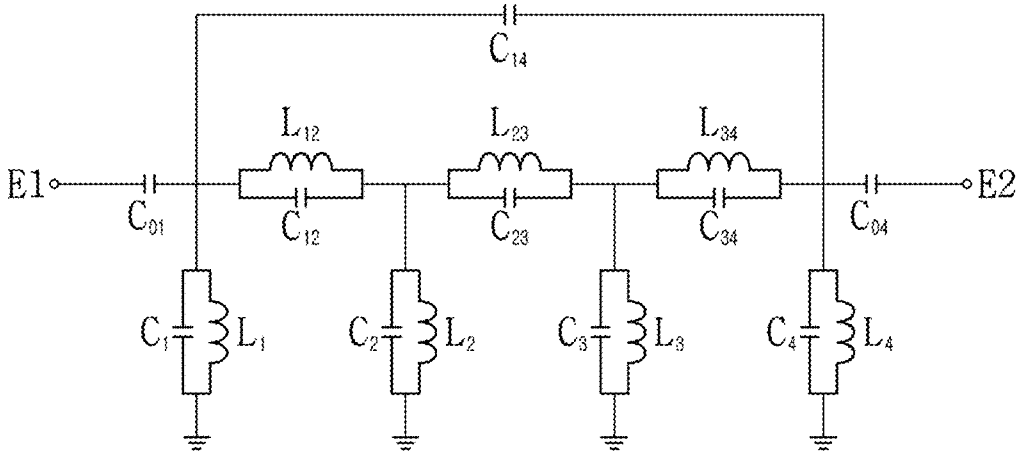
FIG. 8 is a circuit diagram of the mmWave band LC filter shown in FIG. 5.

FIG. 5 is a perspective view showing a mmWave band LC filter 1 according to another embodiment. FIG. 6 is a plan view of the mmWave band LC filter 1 when viewed in the direction of arrow B in FIG. 5. FIG. 7 is a cross-sectional view taken along line C-C' in FIG. 5. FIG. 8 is a circuit diagram of the mmWave band LC filter 1 shown in FIG. 5. FIGS. 5, 6, 7, and 8 will be referred to together.

The mmWave band LC filter 1 according to the other embodiment may include a first ground layer 10, a second ground layer 20, a via wall 40, a blocking wall 41, a hole 30, a pin 50, a pin electrode 60, a floating electrode 70, and an input/output terminal 80. The mmWave band LC filter 1 according to the other embodiment may have a structure including four pins 50.

The blocking wall 41 may divide the resonance space RS into a first sub-space SS1, a second sub-space SS2, a third sub-space SS3, and a fourth sub-space SS4. The first sub-space SS1 and the second sub-space SS2 may be connected to each other through a space defined in the blocking wall 41. The second sub-space SS2 and the third sub-space SS3 may be connected to each other through a space defined in the blocking wall 41. The third sub-space SS3 and the fourth sub-space SS4 may be connected to each other through a space defined in the blocking wall 41. The first sub-space SS1 and the fourth sub-space SS4 may be completely separated from each other by the blocking wall 41. The first sub-space SS1, the second sub-space SS2, the third sub-space SS3, and the fourth sub-space SS4 may be disposed in the counterclockwise or clockwise direction.

The hole 30 may include a first hole 31 formed in a portion of the second ground layer 20 corresponding to the first sub-space SS1, a second hole 32 formed in a portion of the second ground layer 20 corresponding to the second sub-space SS2, a third hole 33 formed in a portion of the second ground layer 20 corresponding to the third sub-space SS3, and a fourth hole 34 formed in a portion of the second ground layer 20 corresponding to the fourth sub-space SS4.

The plurality of pins 50 may include a first pin 51 disposed at the center of the first sub-space SS1 while passing through the first hole 31, a second pin 52 disposed at the center of the second sub-space SS2 while passing through the second hole 32, a third pin 53 disposed at the center of the third sub-space SS3 while passing through the third hole 33, and a fourth pin 54 disposed at the center of the fourth sub-space SS4 while passing through the fourth hole 34. The first pin 51 may be modeled as $L_1$ in FIG. 8. The second pin 52 may be modeled as $L_2$ in FIG. 8. The third pin 53 may be modeled as $L_3$ in FIG. 8. The fourth pin 54 may be modeled as $L_4$ in FIG. 8. Inductive coupling formed between the first pin 51 and the second pin 52 through a connection portion between the first sub-space SS1 and the second sub-space SS2 may be modeled as $L_{12}$ in FIG. 8. Inductive coupling formed between the second pin 52 and the third pin 53 through a connection portion between the second sub-space SS2 and the third sub-space SS3 may be modeled as $L_{23}$ in FIG. 8. Inductive coupling formed between the third pin 53 and the fourth pin 54 through a connection portion between the third sub-space SS3 and the fourth sub-space SS4 may be modeled as $L_{34}$ in FIG. 8. The fourth sub-space SS4 and the first sub-space SS1 are completely separated from each other by the blocking wall 41. Thus, inductive coupling is not formed between the fourth pin 54 and the first pin 51, and $L_{41}$ is not present in FIG. 8.

The pin electrode 60 may include a first pin electrode 61 connected to the other end of the first pin 51, a second pin electrode 62 connected to the other end of the second pin 52, a third pin electrode 63 connected to the other end of the third pin 53, and a fourth pin electrode 64 connected to the other end of the fourth pin 54. A capacitor formed by a portion of the first pin electrode 61, a portion of the second ground layer 20, and the sub-substrate Sb therebetween may be modeled as $C_1$ in FIG. 8. A capacitor formed by a portion of the second pin electrode 62, a portion of the second ground layer 20, and the sub-substrate Sb therebetween may be modeled as $C_2$ in FIG. 8. A capacitor formed by a portion of the third pin electrode 63, a portion of the second ground layer 20, and the sub-substrate Sb therebetween may be modeled as $C_3$ in FIG. 8. A capacitor formed by a portion of the fourth pin electrode 64, a portion of the second ground layer 20, and the sub-substrate Sb therebetween may be modeled as $C_4$ in FIG. 8.

The floating electrode 70 may include a first floating electrode 71 formed to face a portion of the first pin electrode 61 and a portion of the second pin electrode 62, a second floating electrode 72 formed to face a portion of the second pin electrode 62 and a portion of the third pin electrode 63, a third floating electrode 73 formed to face a portion of the third pin electrode 63 and a portion of the fourth pin electrode 64, and a fourth floating electrode 74 formed to face a portion of the fourth pin electrode 64 and a portion of the first pin electrode 61.

One end of the first floating electrode 71, a portion of the first pin electrode 61, the other end of the first floating electrode 71, a portion of the second pin electrode 62, and the sub-substrate Sb therebetween may be modeled as $C_{12}$ in FIG. 8. One end of the second floating electrode 72, a portion of the second pin electrode 62, the other end of the second floating electrode 72, a portion of the third pin electrode 63, and the sub-substrate Sb therebetween may be modeled as $C_{23}$ in FIG. 8. One end of the third floating electrode 73, a portion of the third pin electrode 63, the other end of the third floating electrode 73, a portion of the fourth pin electrode 64, and the sub-substrate Sb therebetween may be modeled as $C_{34}$ in FIG. 8. One end of the fourth floating electrode 74, a portion of the fourth pin electrode 64, the other end of the fourth floating electrode 74, a portion of the first pin electrode 61, and the sub-substrate Sb therebetween may be modeled as $C_{14}$ in FIG. 8.

The input/output terminal 80 may include a first input/output terminal 81 spaced apart from the first pin electrode 61 while partially facing the first pin electrode 61 and a second input/output terminal 82 spaced apart from the fourth pin electrode 64 while partially facing the fourth pin electrode 64. A portion of the first input/output terminal 81, a portion of the first pin electrode 61, and the sub-substrate Sb therebetween may be modeled as $C_{01}$ in FIG. 8. A portion of the second input/output terminal 82, a portion of the fourth pin electrode 64, and the sub-substrate Sb therebetween may be modeled as $C_{04}$ in FIG. 8. The first input/output terminal 81 and the second input/output terminal 82 may be represented by E1 and E2 in FIG. 8.

The mmWave band LC filter 1 described with reference to FIGS. 5, 6, 7, and 8 is an LC-type filter including four pins 50 and four resonators. If the disclosed technique is applied, it is also possible to implement an LC-type filter having more than or less than four resonators.

Figure 9:
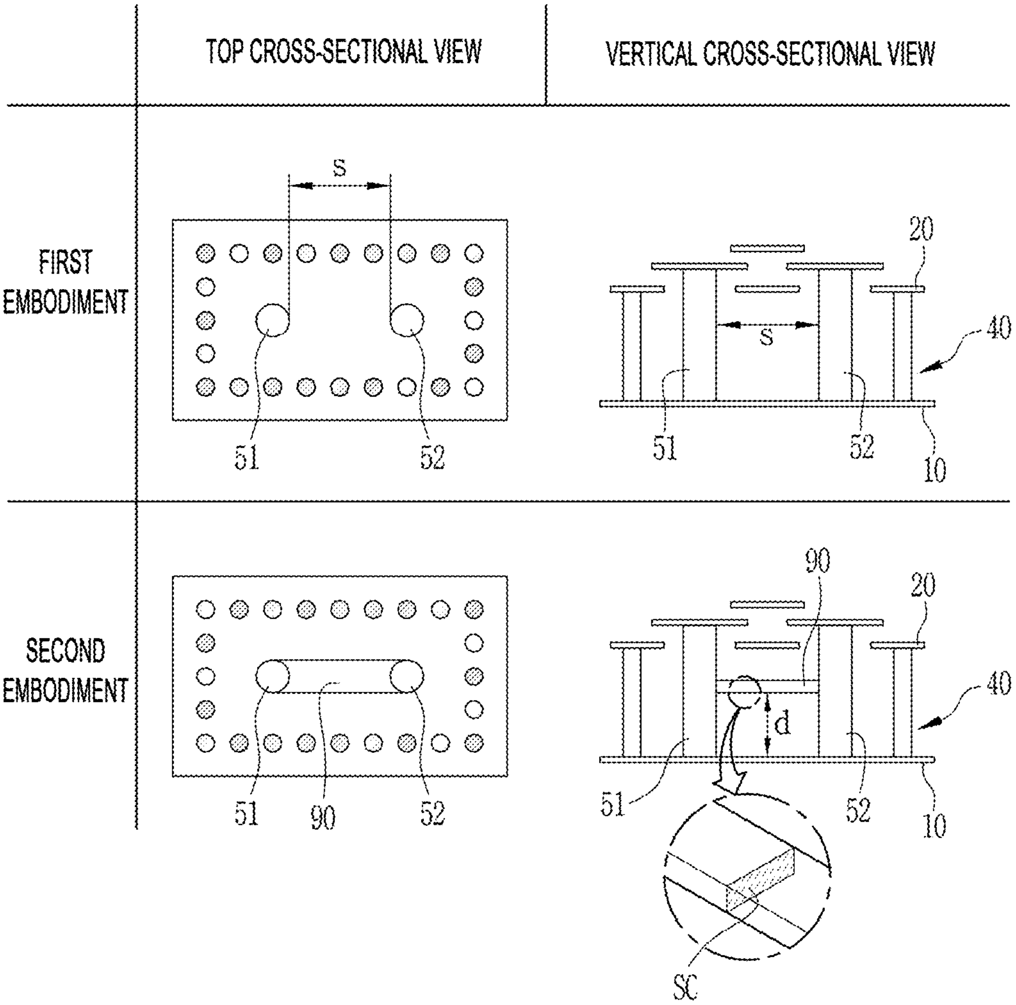
FIG. 9 is a view showing comparison between an embodiment including a bridge according to an embodiment and an embodiment not including the bridge.

FIG. 9 is a view showing comparison between an embodiment including a bridge 90 according to an embodiment and an embodiment not including the bridge 90. The top cross-sectional view in FIG. 9 is a cross-sectional view taken along line E-E' in FIG. 1. The vertical cross-sectional view in FIG. 9 is a cross-sectional view taken along line A-A' in FIG. 1. The first embodiment in FIG. 9 is a mmWave band LC filter 1 without the bridge 90, and the second embodiment in FIG. 9 is a mmWave band LC filter 1 with the bridge 90.

Figure 10:
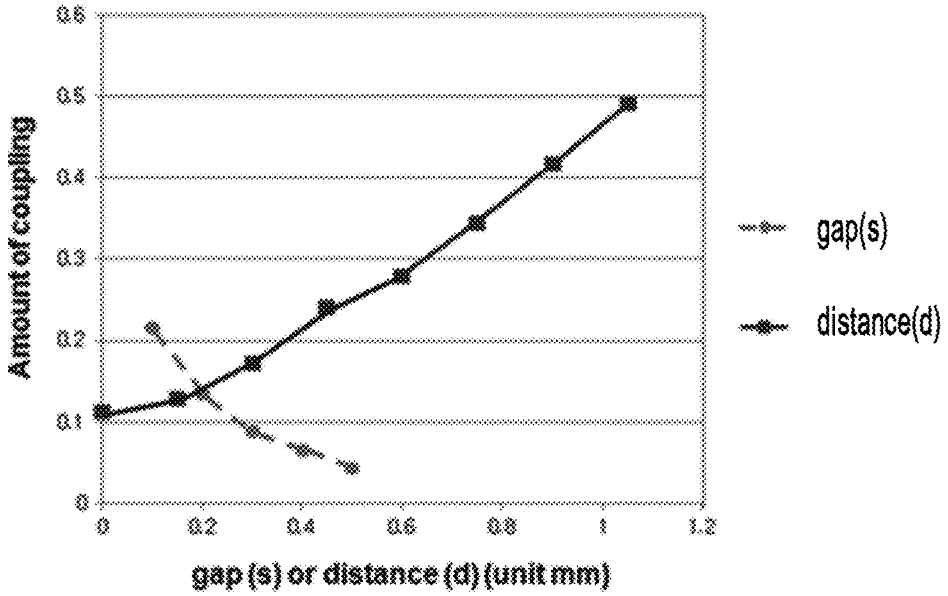
FIG. 10 is a graph indicating inductive coupling of the mmWave band LC filter including the bridge according to an embodiment.

FIG. 10 is a graph indicating inductive coupling of the mmWave band LC filter 1 including the bridge 90 according to an embodiment. In FIG. 10, the vertical axis represents the amount of coupling of inductance between the two pins 50, and the horizontal axis represents gap s between the two pins 50 or distance d between the bridge 90 and the first ground layer 10.

In the first embodiment, the first pin 51 and the second pin 52 are disposed in the resonance space RS defined by the via wall 40, and inductive coupling is present between the first pin 51 and the second pin 52. The amount of inductive coupling is inversely proportional to the gap S between the first pin 51 and the second pin 52. It can be seen from FIG. 10 that the smaller the gap S, the greater the inductive coupling. As the gap between the first pin 51 and the second pin 52 decreases, the electromagnetic coupling becomes stronger, and thus the inductive coupling increases.

The gap S between the first pin 51 and the second pin 52 may not be reduced below a predetermined minimum gap due to limitations in the manufacturing process. When a larger amount of inductive coupling than the amount of inductive coupling between the first pin 51 and the second pin 52 disposed with the minimum gap therebetween is required, there is limitation in increasing the amount of inductive coupling because reducing the minimum gap is impossible.

In order to increase the amount of inductive coupling, the mmWave band LC filter 1 may further include one or more bridges 90 interconnecting two pins 50 among the plurality of pins 50.

In the second embodiment, the mmWave band LC filter 1 may include a first pin 51 and a second pin 52 disposed in the resonance space RS defined by the via wall 40, and may further include a bridge 90 interconnecting the first pin 51 and the second pin 52. The bridge 90 may increase the amount of inductive coupling. The bridge 90 may interconnect the first pin 51 and the second pin 52 in order to provide a path along which current flows between the first pin 51 and the second pin 52. The direct flow of current between the first pin 51 and the second pin 52 may have the same effect as increase in inductive coupling between the first pin 51 and the second pin 52.

The distance d between the bridge 90 and the first ground layer 10 may be determined in accordance with required increase in the amount of inductive coupling between the two pins 50. If the required increase in the amount of inductive coupling is large, the bridge 90 may be located far from the first ground layer 10, and if the required increase in the amount of inductive coupling is small, the bridge 90 may be located close to the first ground layer 10.

As the distance d between the bridge 90 and the first ground layer 10 increases, the amount of inductive coupling may increase more greatly. A high-frequency signal is strong on the other surface of the pin 50, and is gradually attenuated and flows weakly as the signal approaches one surface of the pin 50. If the bridge 90 is located close to the second ground layer 20, a relatively strong high-frequency signal may be transmitted between the two pins 50, and thus the amount of inductive coupling may increase greatly. If the bridge 90 is located close to the first ground layer 10, a relatively weak high-frequency signal may be transmitted between the two pins 50, and thus the amount of inductive coupling may increase slightly.

It can be seen from FIG. 10 that, as the distance d between the bridge 90 and the first ground layer 10 increases, the amount of inductive coupling between the two pins 50 increases more greatly.

The cross-sectional area CS of the bridge 90 may be determined in accordance with required increase in the amount of inductive coupling between the two pins 50. If the required increase in the amount of inductive coupling is large, the cross-sectional area CS of the bridge 90 may be formed to be large, and if the required increase in the amount of inductive coupling is small, the cross-sectional area CS of the bridge 90 may be formed to be small. As the cross-sectional area CS of the bridge 90 increases, the amount of inductive coupling may increase more greatly. If the cross-sectional area CS of the bridge 90 is large, the amount of current flowing therethrough increases. Therefore, as the cross-sectional area CS of the bridge 90 increases, increase in the amount of inductive coupling may be greater. On the other hand, if the cross-sectional area CS of the bridge 90 decreases, the amount of current flowing therethrough is small. Therefore, as the cross-sectional area CS of the bridge 90 increases, increase in the amount of inductive coupling may be greater.

Because the overall size of the mmWave band LC filter 1 according to the embodiment is small, variation in increase in the amount of inductive coupling depending on adjustment of the distance between the bridge 90 and the first ground layer 10 is greater than variation in increase in the amount of inductive coupling depending on adjustment of the cross-sectional area CS of the bridge 90. The gap S may be first determined in order to determine overall increase in the amount of inductive coupling, and the cross-sectional area CS may be secondarily determined in order to finely adjust increase in the amount of inductive coupling. In this way, the amount of inductive coupling may be finely designed.

Figure 11:
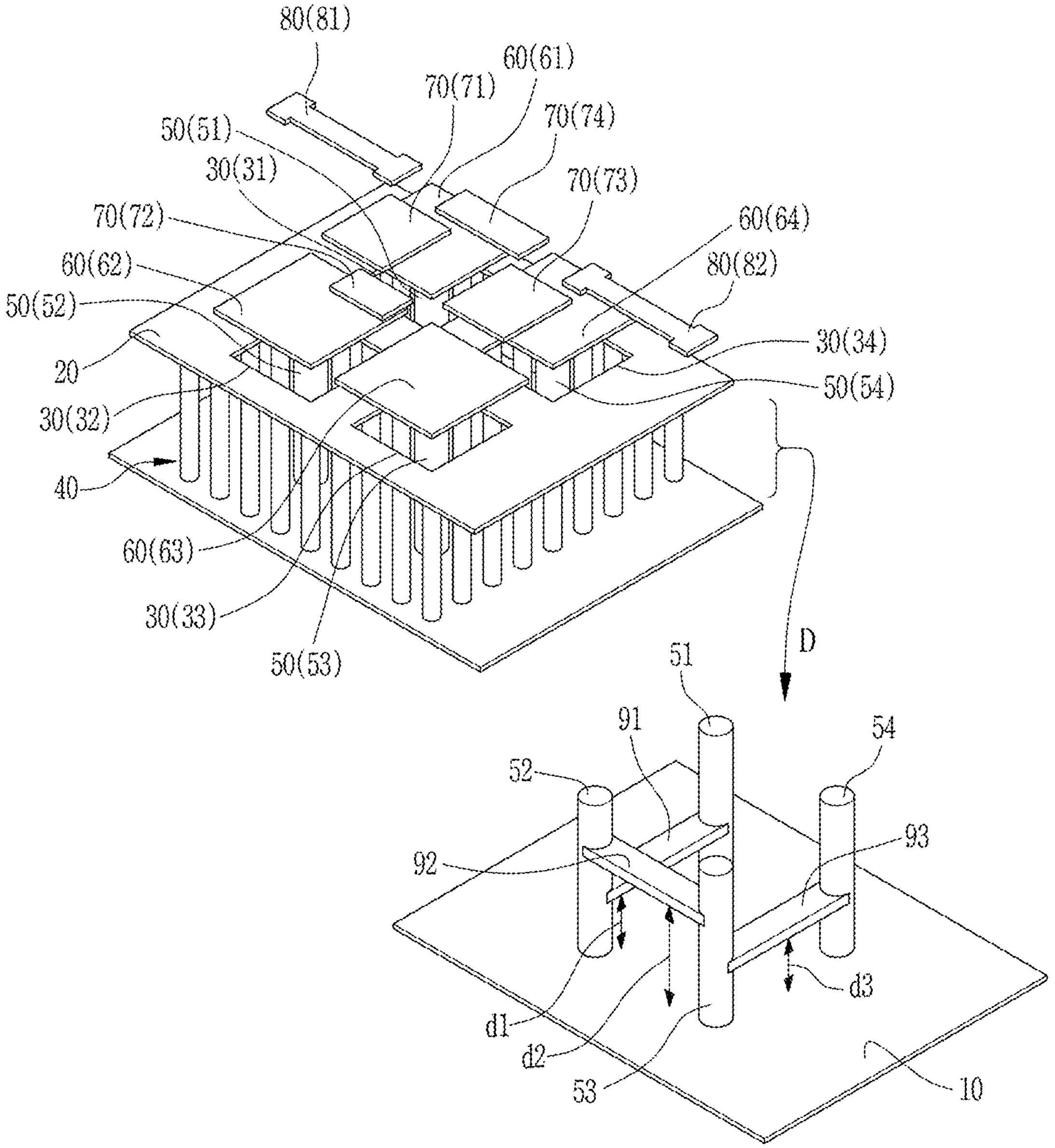
FIG. 11 is a perspective view of a mmWave band LC filter including a bridge according to another embodiment.
Figure 12:
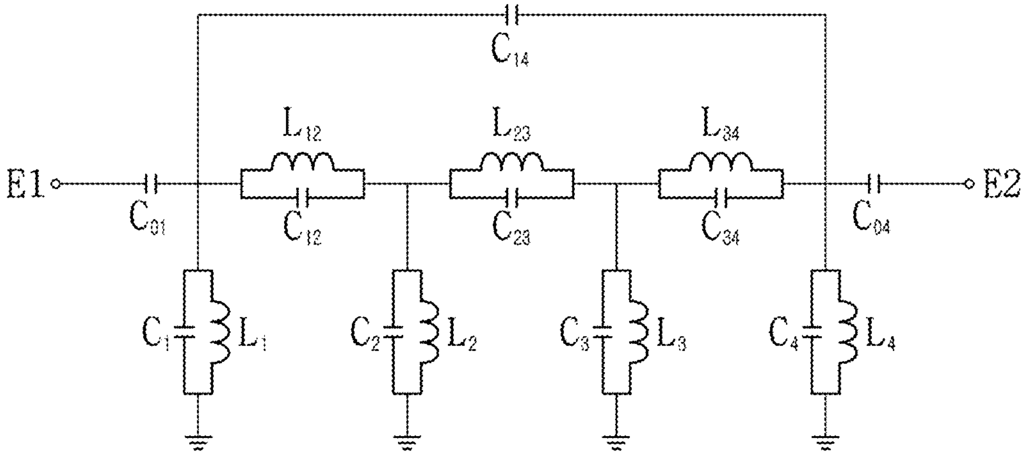
FIG. 12 is a circuit diagram of the mmWave band LC filter shown in FIG. 11.
Figure 13:
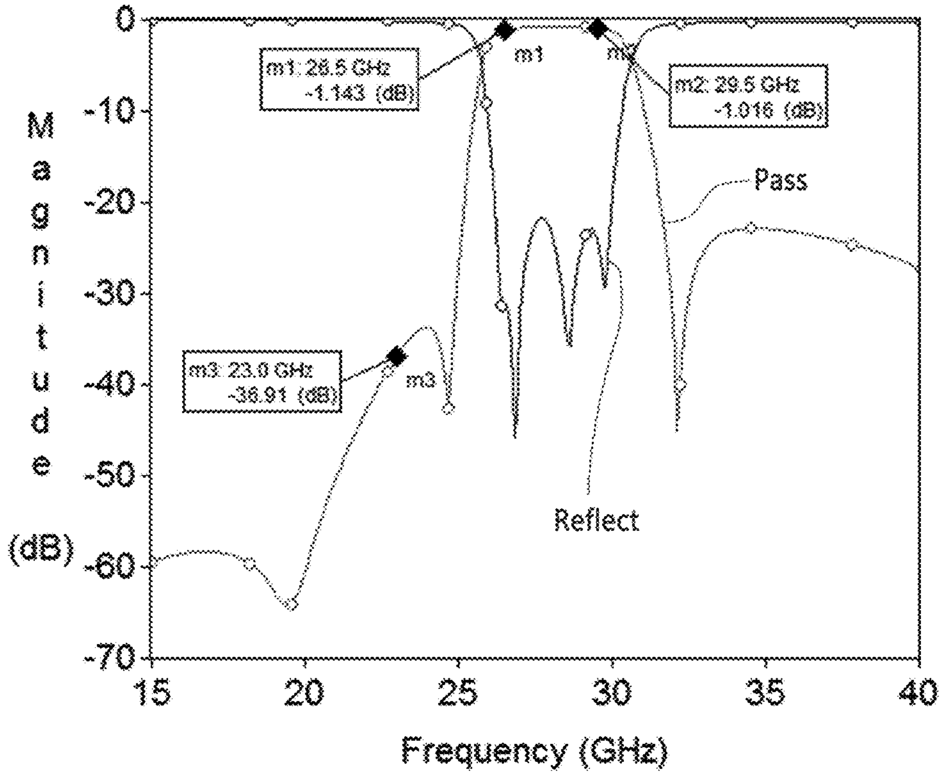
FIG. 13 is a graph indicating the characteristics of the mmWave band LC filter shown in FIG. 11.

FIG. 11 is a perspective view of a mmWave band LC filter 1 including a bridge 90 according to another embodiment. FIG. 12 is a circuit diagram of the mmWave band LC filter 1 shown in FIG. 11. FIG. 13 is a graph indicating the characteristics of the mmWave band LC filter 1 shown in FIG. 11. FIGS. 11, 12, and 13 will be referred to together.

The mmWave band LC filter 1 including the four pins 50 according to the still other embodiment may further include a bridge 90 interconnecting two pins 50 among the first pin 51, the second pin 52, the third pin 53, and the fourth pin 54. The bridge 90 may include a first bridge 91 interconnecting the first pin 51 and the second pin 52, a second bridge 92 interconnecting the second pin 52 and the third pin 53, and a third bridge 93 interconnecting the third pin 53 and the fourth pin 54.

It can be seen from the enlarged view in FIG. 11 that the first bridge 91 and the third bridge 93 are disposed relatively close to the first ground layer 10 and the second bridge 92 is disposed relatively far from the first ground layer 10. For example, a first distance d1 between the first bridge 91 and the first ground layer 10 and a third distance d3 between the third bridge 93 and the first ground layer 10 may be equal to each other, and a second distance d2 between the second bridge 92 and the first ground layer 10 may be greater than the first distance d1 between the first bridge 91 and the first ground layer 10.

If the positions of the first bridge 91, the second bridge 92, and the third bridge 93 relative to each other are set as shown in FIG. 11, it is possible to design a filter in which the band rejection characteristic in a low-frequency band (about 15 GHz to about 25 GHz) based on a pass band (about 26 GHz to about 30 GHz) is improved compared to the band rejection characteristic in a high-frequency band (about 35 GHz or higher) based on the pass band (refer to FIG. 13).

To the contrary, if the first bridge 91 and the third bridge 93 are disposed relatively far from the first ground layer 10 and the second bridge 92 is disposed relatively close to the first ground layer 10, it is possible to design a filter in which the band rejection characteristic in a high-frequency band (about 35 GHz or higher) based on the pass band is improved compared to the band rejection characteristic in a low-frequency band (about 15 GHz to about 25 GHz) based on the pass band (refer to FIG. 13).

Figure 14:
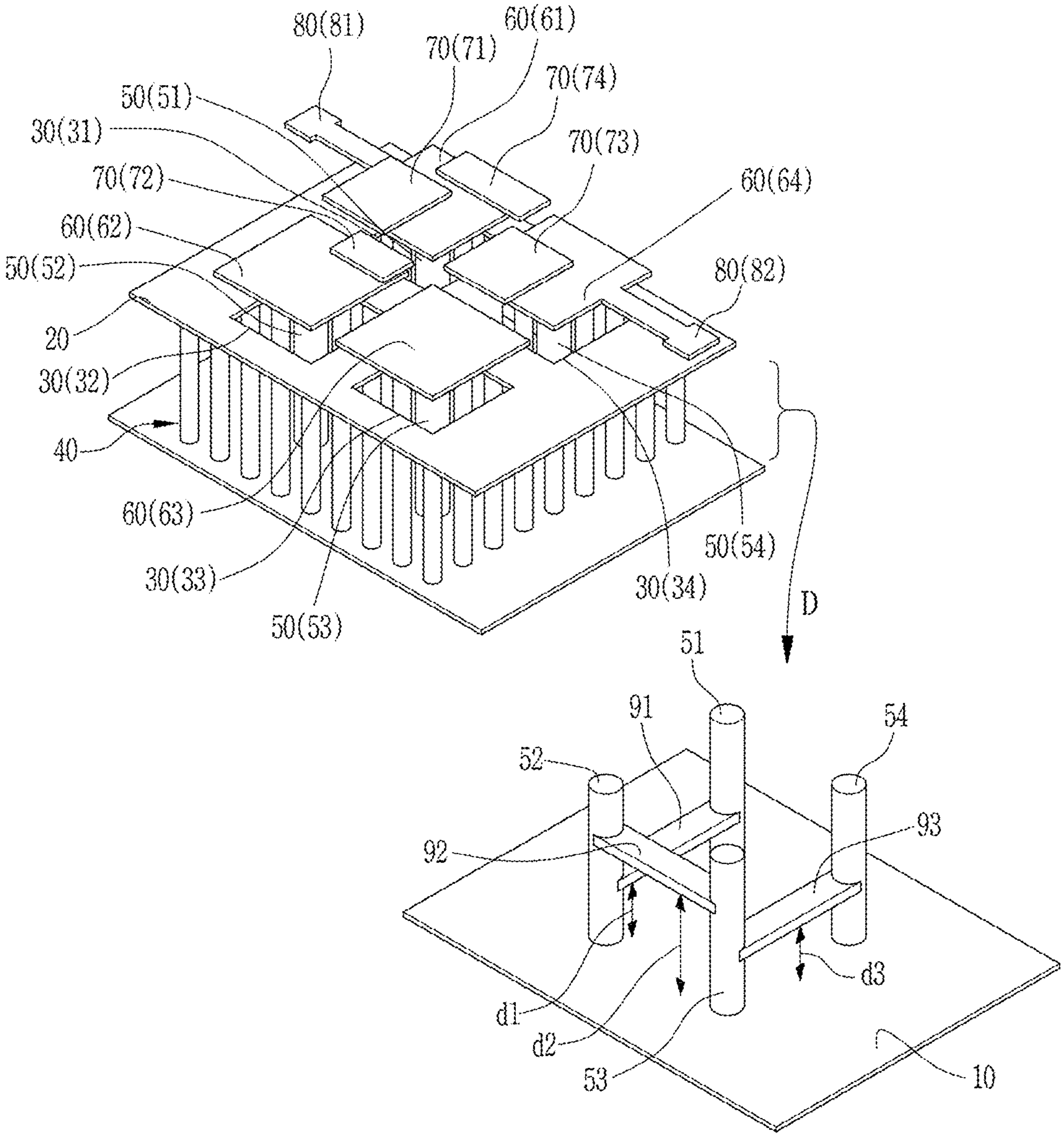
FIG. 14 is a perspective view of a mmWave band LC filter including a bridge according to still another embodiment.
Figure 15:
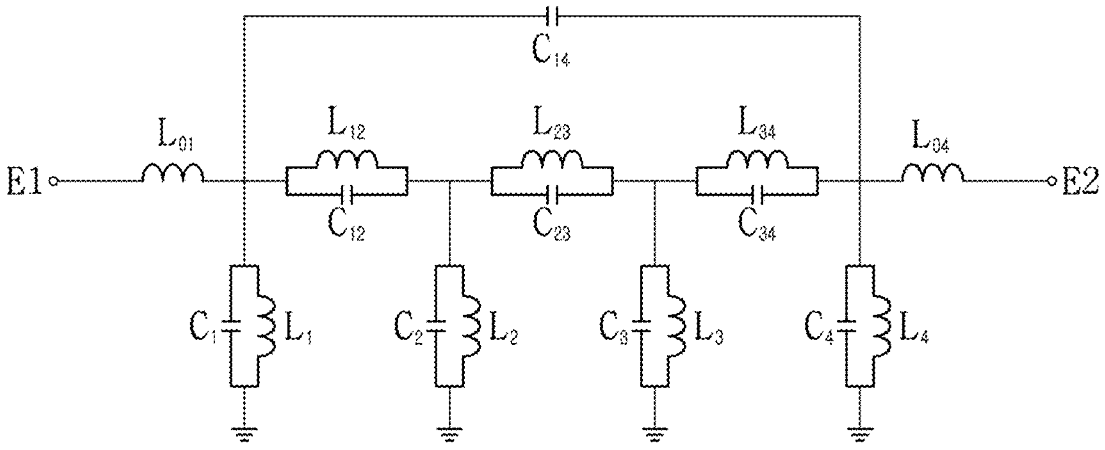
FIG. 15 is a circuit diagram of the mmWave band LC filter shown in FIG. 14.
Figure 16:
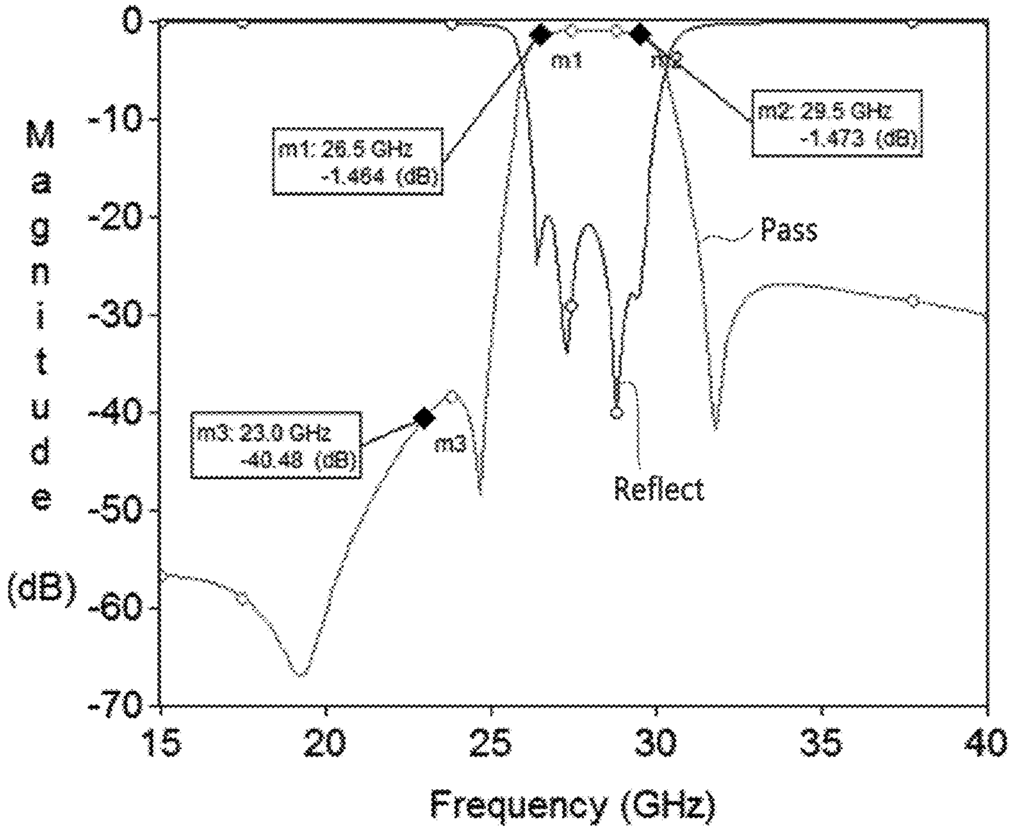
FIG. 16 is a graph indicating the characteristics of the mmWave band LC filter shown in FIG. 14.

FIG. 14 is a perspective view of a mmWave band LC filter 1 including a bridge 90 according to still another embodiment. FIG. 15 is a circuit diagram of the mmWave band LC filter 1 shown in FIG. 14. FIG. 16 is a graph indicating the characteristics of the mmWave band LC filter 1 shown in FIG. 14. The mmWave band LC filter 1 according to this embodiment will be described with reference to FIGS. 14, 15, and 16 through comparison with the embodiment shown in FIGS. 11, 12, and 13.

The mmWave band LC filter 1 shown in FIG. 11 and the mmWave band LC filter 1 shown in FIG. 14 have the same structure in which the four pins 50 are provided, the first bridge 91 and the third bridge 93 are disposed close to the first ground layer 10, and the second bridge 92 is disposed far from the first ground layer 10. There is a difference in connection of the input/output terminals 80 between the mmWave band LC filters 1 shown in FIGS. 11 and 14. When the mmWave band LC filter 1 is connected to an external circuit, signals may be input and output through an inductor or a capacitor.

The mmWave band LC filter 1 shown in FIG. 11 has a structure in which the first input/output terminal 81 is spaced apart from the first pin electrode 61 while partially facing the first pin electrode 61 and the second input/output terminal 82 is spaced apart from the fourth pin electrode 64 while partially facing the fourth pin electrode 64. That is, the first input/output terminal 81, the first pin electrode 61, and the sub-substrate Sb therebetween function as a capacitor, and the second input/output terminal 82, the fourth pin electrode 64, and the sub-substrate Sb therebetween function as a capacitor. The mmWave band LC filter 1 shown in FIG. 11 may be used to transmit and receive signals through a capacitor when connected to an external circuit.

The input/output terminals 80 of the mmWave band LC filter 1 shown in FIG. 14 may include a first input/output terminal 81 connected to the first pin electrode 61 and a second input/output terminal 82 connected to the fourth pin electrode 64. The mmWave band LC filter 1 shown in FIG. 14 may be used to transmit and receive signals through an inductor when connected to an external circuit. The connection structure of the first input/output terminal 81 and the first pin electrode 61 in FIG. 14 may be modeled as $L_{01}$ in FIG. 15. The connection structure of the second input/output terminal 82 and the fourth pin electrode 64 in FIG. 14 may be modeled as $L_{04}$ in FIG. 15.

It can be confirmed that the pass characteristic graph Pass shown in FIG. 13 and the pass characteristic graph Pass shown in FIG. 16 are substantially similar to each other and the values of three points m1, m2, and m3 shown in FIG. 13 and the values of three points m1, m2, and m3 shown in FIG. 16 are substantially similar to each other. That is, it can be confirmed that the structure shown in FIG. 11, which transmits and receives signals through a capacitor, and the structure shown in FIG. 14, which transmits and receives signals through an inductor, may be designed to have similar pass characteristics. It can be confirmed that the reflection characteristic graphs Reflect shown in FIGS. 13 and 16 have a sufficiently low value in the pass band. Therefore, it can be seen that the impedance matching in the mmWave band LC filter 1 according to the embodiment is sufficiently implemented and signal loss is small.

According to the embodiments of the present disclosure described above, there may be provided a mmWave band LC filter 1 that is applied to a high-frequency signal in a mmWave band. In addition, there may be provided a mmWave band LC filter 1 that uses a coaxial-type resonance space RS, i.e., a structure in which a pin 50 is disposed at the center of the space surrounded by the via wall 40. In addition, there may be provided a small multilayer mmWave band LC filter 1 that is easily designed in an LC type in a mmWave band. In addition, it is possible to minimize the number of resonators and to implement a low-loss band-pass characteristic by freely adjusting inductive coupling of adjacent resonators. It is possible to increase inductive coupling between resonators, a gap between which cannot be reduced below a predetermined value due to limitations in the manufacturing process.

As is apparent from the above description, according to an embodiment of the present disclosure, it is possible to provide a mmWave band LC filter that is applied to a high-frequency signal in a mmWave band.

According to an embodiment of the present disclosure, it is possible to provide a mmWave band LC filter that uses a coaxial-type resonance space, i.e., a structure in which a pin is disposed at the center of a space surrounded by a via wall.

According to an embodiment of the present disclosure, it is possible to provide a small multilayer mmWave band LC filter that is easily designed in an LC type in a mmWave band.

According to an embodiment of the present disclosure, it is possible to minimize the number of resonators and to implement a low-loss band-pass characteristic by freely adjusting inductive coupling of adjacent resonators.

According to an embodiment of the present disclosure, it is possible to increase inductive coupling between resonators, a gap between which cannot be reduced below a predetermined value due to limitations in the manufacturing process.

Although preferred embodiments of the present disclosure have been illustrated and described in order to exemplify the principle of the present disclosure, the present disclosure is not limited to the specific embodiments. It will be understood that various modifications and changes can be made by those skilled in the art without departing from the spirit and scope of the disclosure as defined by the appended claims.

What is claimed is:

1. A millimeter-wave (mmWave) band LC filter comprising:

a first ground layer configured to provide an electrical ground;

a second ground layer spaced apart from the first ground layer;

a via wall having one end connected to the first ground layer and an other end connected to the second ground layer, the via wall comprising a plurality of vias spaced apart from each other;

a blocking wall formed as a part of the via wall so as to protrude toward an interior of a resonance space defined by the first ground layer, the via wall, and the second ground layer, thereby dividing the resonance space into a plurality of sub-spaces;

a plurality of holes, each being formed in the second ground layer to open one side of a respective one of the plurality of sub-spaces divided by the blocking wall;

a plurality of pins, each having one end connected to the first ground layer and an other end passing through a respective one of the plurality of holes;

a plurality of pin electrodes, each being connected to the other end of a respective one of the plurality of pins, spaced apart from the second ground layer, and formed to face a portion of the second ground layer;

a floating electrode spaced apart from the plurality of pin electrodes and formed to face portions of two pin electrodes among the plurality of pin electrodes; and a plurality of input/output terminals directly connected to or spaced apart from the plurality of pin electrodes and configured to receive and output signals.

2. The mmWave band LC filter according to claim 1, further comprising one or more bridges interconnecting two pins among the plurality of pins.

3. The mmWave band LC filter according to claim 2, wherein a distance between the bridge and the first ground layer is determined in accordance with required increase in an amount of inductive coupling between the two pins, and wherein, as the distance between the bridge and the first ground layer increases, the amount of inductive coupling increases more greatly.

4. The mmWave band LC filter according to claim 2, wherein a cross-sectional area of the bridge is determined in accordance with required increase in an amount of inductive coupling between the two pins, and wherein, as the cross-sectional area of the bridge increases, the amount of inductive coupling increases more greatly.

5. The mmWave band LC filter according to claim 1, wherein the blocking wall divides the resonance space into a first sub-space and a second sub-space, wherein the first sub-space and the second sub-space are connected to each other through a space defined in the blocking wall, wherein the plurality of holes comprises a first hole formed in a portion of the second ground layer corresponding to the first sub-space and a second hole formed in a portion of the second ground layer corresponding to the second sub-space, wherein the plurality of pins comprises a first pin disposed at a center of the first sub-space while passing through the first hole and a second pin disposed at a center of the second sub-space while passing through the second hole, wherein the plurality of pin electrodes comprises a first pin electrode connected to the other end of the first pin and a second pin electrode connected to the other end of the second pin, wherein the floating electrode is formed to face a portion of the first pin electrode and a portion of the second pin electrode, and wherein the plurality of input/output terminals comprises a first input/output terminal spaced apart from the first pin electrode while partially facing the first pin electrode and a second input/output terminal spaced apart from the second pin electrode while partially facing the second pin electrode.

6. The mmWave band LC filter according to claim 5, further comprising a bridge interconnecting the first pin and the second pin.

7. The mmWave band LC filter according to claim 1, wherein the blocking wall divides the resonance space into a first sub-space, a second sub-space, a third sub-space, and a fourth sub-space, wherein the first sub-space and the second sub-space are connected to each other through a space defined in the blocking wall, the second sub-space and the third sub-space are connected to each other through a space defined in the blocking wall, the third sub-space and the fourth sub-space are connected to each other through a space defined in the blocking wall, and the first sub-space and the fourth sub-space are completely separated from each other by the blocking wall, wherein the plurality of holes comprises a first hole formed in a portion of the second ground layer corresponding to the first sub-space, a second hole formed in a portion of the second ground layer corresponding to the second sub-space, a third hole formed in a portion of the second ground layer corresponding to the third sub-space, and a fourth hole formed in a portion of the second ground layer corresponding to the fourth sub-space, wherein the plurality of pins comprises a first pin disposed at a center of the first sub-space while passing through the first hole, a second pin disposed at a center of the second sub-space while passing through the second hole, a third pin disposed at a center of the third sub-space while passing through the third hole, and a fourth pin disposed at a center of the fourth sub-space while passing through the fourth hole, wherein the plurality of pin electrodes comprises a first pin electrode connected to the other end of the first pin, a second pin electrode connected to the other end of the second pin, a third pin electrode connected to the other end of the third pin, and a fourth pin electrode connected to the other end of the fourth pin, and wherein the floating electrode comprises a first floating electrode formed to face a portion of the first pin electrode and a portion of the second pin electrode, a second floating electrode formed to face a portion of the second pin electrode and a portion of the third pin electrode, a third floating electrode formed to face a portion of the third pin electrode and a portion of the fourth pin electrode, and a fourth floating electrode formed to face a portion of the fourth pin electrode and a portion of the first pin electrode.

8. The mmWave band LC filter according to claim 7, wherein the plurality of input/output terminals comprises a first input/output terminal connected to the first pin electrode and a second input/output terminal connected to the fourth pin electrode.

9. The mmWave band LC filter according to claim 7, wherein the plurality of input/output terminals comprises a first input/output terminal spaced apart from the first pin electrode while partially facing the first pin electrode and a second input/output terminal spaced apart from the fourth pin electrode while partially facing the fourth pin electrode.

10. The mmWave band LC filter according to claim 7, further comprising one or more bridges interconnecting two pins among the first pin, the second pin, the third pin, and the fourth pin.

11. The mmWave band LC filter according to claim 10, wherein the one or more bridges comprise a first bridge interconnecting the first pin and the second pin, a second bridge interconnecting the second pin and the third pin, and a third bridge interconnecting the third pin and the fourth pin.

12. The mmWave band LC filter according to claim 1, wherein the mmWave band LC filter is formed inside a multilayer substrate formed by stacking a plurality of sub-substrates.

* * * * *